US007830197B2

(12) United States Patent
Stellberger et al.

(10) Patent No.: US 7,830,197 B2
(45) Date of Patent: Nov. 9, 2010

(54) ADJUSTABLE INTEGRATOR USING A SINGLE CAPACITANCE

(75) Inventors: Achim Stellberger, Kronau (DE); Michael Keller, Heidelberg (DE); Paul Zehnich, Altrip (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 32 days.

(21) Appl. No.: 12/317,421

(22) Filed: Dec. 22, 2008

(65) Prior Publication Data

US 2010/0156501 A1 Jun. 24, 2010

(51) Int. Cl.
*H03K 5/00* (2006.01)

(52) U.S. Cl. ........................ 327/336; 327/558; 327/552

(58) Field of Classification Search ......... 327/336–345, 327/551–559

See application file for complete search history.

(56) References Cited

U.S. PATENT DOCUMENTS

| | | | |
|---|---|---|---|
| 4,059,812 A | 11/1977 | Procter | |
| 4,251,743 A * | 2/1981 | Hareyama | 327/538 |
| 4,703,249 A * | 10/1987 | De La Plaza et al. | 323/316 |
| 4,777,541 A * | 10/1988 | Knowlton | 386/85 |
| 6,577,180 B2 * | 6/2003 | Liu | 327/532 |
| 6,608,516 B1 | 8/2003 | Lennous | |
| 2003/0058039 A1 | 3/2003 | Noro | |
| 2005/0179468 A1 | 8/2005 | Zhou et al. | |
| 2007/0229161 A1 | 10/2007 | Killat | |

FOREIGN PATENT DOCUMENTS

| | | |
|---|---|---|
| EP | 0 944 246 | 9/1999 |
| EP | 08368021.5-2215 | 5/2009 |

* cited by examiner

*Primary Examiner*—Dinh T. Le
(74) *Attorney, Agent, or Firm*—Saile Ackerman LLC; Stephen B. Ackerman

(57) ABSTRACT

An integrating amplifier on an IC, which comprises a feedback loop using an external device as an integrating capacitor, has added a second feedback loop that provides an additional current to the input of the amplifier, which current can be used to increase the input range of the charge that can be measured without needing another external capacitor or pad.

15 Claims, 4 Drawing Sheets

FIG. 1 – Prior Art

ADJUSTABLE INTEGRATOR USING A SINGLE CAPACITANCE

BACKGROUND OF THE INVENTION

1. Field of the Invention

The invention relates to a circuit and a method for an integrating amplifier which increases the input range of the charge that can be measured, and more particularly to an integrating amplifier on an IC where an internal feedback loop is added thereby eliminating the need for a another external capacitor and pad.

2. Description of the Related Art

To measure charge and thus capacitance, an amplifier wired as an integrator could be used. The charge to be measured is injected into the input of the amplifier and from there is fed, via an integrating capacitance, to the output of the amplifier. The measurement is initiated by a current pulse on the input of the integrator. The integrating capacitance, connected between the negative input and the output of the amplifier, collects the charge transferred by the input pulse. Because of the limited output swing of the amplifier the amount of the charge that can be measured is limited. In current designs the range for the charge to be measured is changed by changing the integration capacitance. In integrated circuits, where an external device is used as integration capacitor, this method requires not only an additional capacitor but an additional pad. This is a disadvantage for designs which need to be placed inside small packages and where pads are either at a premium or not at all available.

Referring now to FIG. 1, we describe a circuit 10 of the current practice requiring an additional pad for a second external integrating capacitor. Circuit 10 comprises an amplifier 11*a* having a minus (−) and a plus (+) input, and an output OUT. The minus input is coupled via pad 11*b* to input IN which provides current pulses $Q=I_{IN}t$ from a current pulse generator 15. The plus input is coupled to a reference voltage $V_{REF}$, for example GROUND. Output OUT, providing current $I_{OUT}$ and voltage $V_{OUT}$, is coupled via pad 12*b*, an external integrating capacitor 12*a* ($C_{INT}$), and pad 12*c* to the minus input of amplifier 11*a*. Output OUT is also coupled via switch 14 (S1), additional pad 13*b*, a second external integrating capacitor 13*a* ($C_{INT^*}$), and pad 12*c* to the minus input of amplifier 11*a*.

In an ordinary integrator, charge is transferred to the capacitance to be measured by a voltage pulse causing an integration current to flow. The amplifier delivers this current by adjusting its output voltage. The charge on the capacitor $C_{INT}$ is equal to the charge introduced by the current pulses at input IN:

$$Q=I_{INT}t$$

resulting in an output of:

$$V_{OUT}=\frac{I_{INT}t}{C_{INT}}$$

To measure a larger charge within the given output voltage range in current designs, the integration capacitor needs to be adjusted, that is another external capacitor needs to be added. The disadvantage of this circuit is that it needs an additional pad and that other external capacitor, leading to a higher module cost and a bigger die area. There is presently no known way to avoid this problem. The below described invention is directed to a circuit arrangement which offers a novel solution.

U.S. Patents which Relate to the Present Invention are:

U.S. Pat. No. 6,608,516 (Lennous) discloses a system and method for adjusting the time constant of an integrator. In one embodiment, a variable time constant integrator includes an amplifier, a capacitor, and a variable gain element. In another embodiment, the variable gain element may include a MDAC (Multiplying Digital to Analog Converter). The Patent refers to signal conditioning and uses a voltage feedback to limit the range.

U.S. Patent Application 2007/0229161 (Killat) teaches methods and circuits for a low noise and high linear voltage-to-current converter which requires only small integration resistors. The circuit uses a shunt to measure the current, where a current IDC used as feedback is static and is derived from a bias voltage. Current IDC is used to set the DC operating point.

U.S. Pat. No. 4,059,812 (Proctor) describes a phase-locked-loop which comprises an adjustable integrator further comprising an integrating amplifier and an adjustable voltage source applied to one integrating amplifier input. The output of the integrating amplifier changes the set time of one or more one-shot controls feeding back to the adjustable integrator and thus to the integrating amplifier.

It should be noted that none of the above-cited examples of the related art have the features and advantages of the invention described below.

SUMMARY OF THE INVENTION

It is an object of at least one embodiment of the present invention to provide a method and an apparatus to increase the amount of charge that can be measured by an integrating amplifier.

It is another object of the present invention to limit the number of external capacitors to one.

It is yet another object of the present invention to increase the input range of the charge without using an additional capacitor.

It is still another object of the present invention to make the input range adjustable.

It is a further object of the present invention to limit the number of pads needed for measuring the amount of charge to two.

It is yet a further object of the present invention to prevent a DC offset in a current mirror.

These and many other objects have been achieved by coupling an output stage, comprising a current mirror, to the integrating amplifier. The output of the first current source of the current mirror is coupled via the external integrating capacitor to the input of the integrating amplifier. The output of the second current source of the current mirror, which mirrors the current of the first current source and thus the output current of the integrating amplifier, is fed back to the output of the integrating amplifier. The output of the first current source is also coupled to a load device, the active load, which generates the bias current for the first current source. The second current source replicates the output current of the first current source by a factor “m”, where the factor “m” is variable and is determined by the range switching required. To avoid a DC offset in the current of the current mirror, a switch is coupled between the first current source and the load device to switch off the active load for the output stage during the integration phase.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

Use of the same reference number in different figures indicates similar or like elements.

DESCRIPTION OF THE PREFERRED EMBODIMENT

Figure 1:
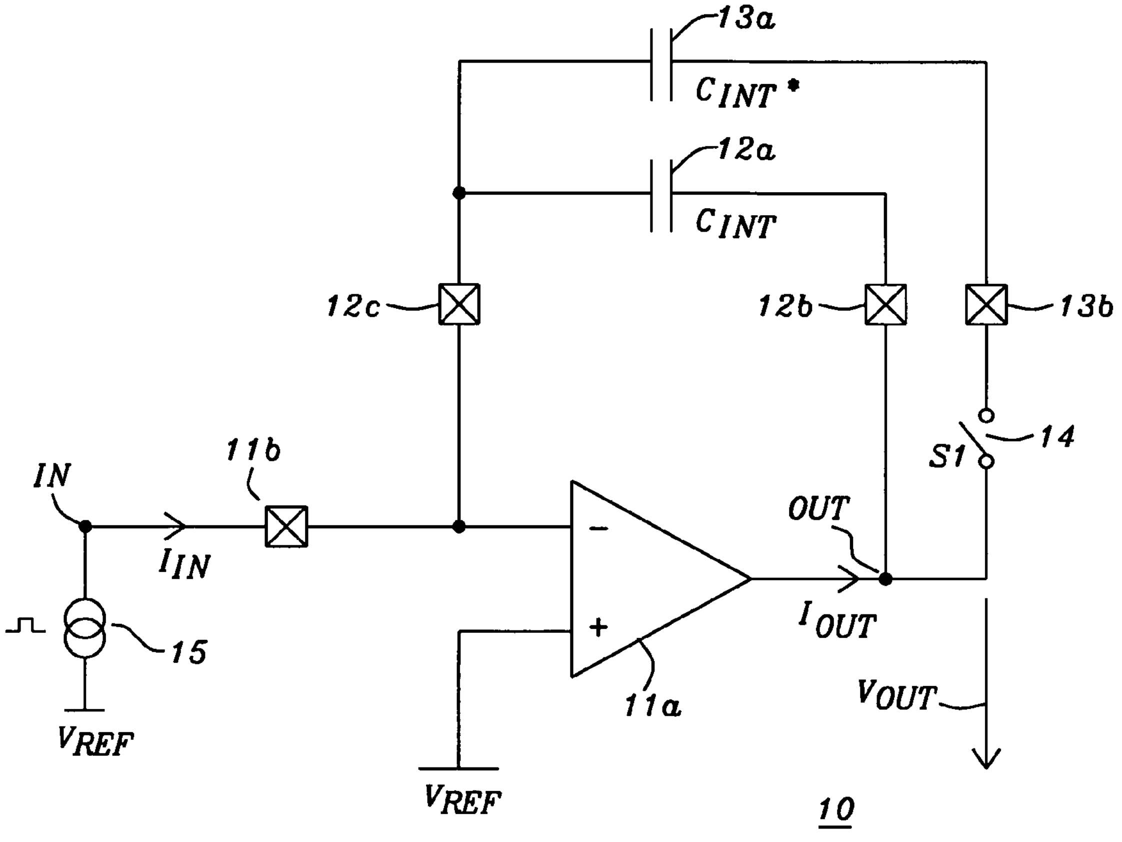
FIG. 1 is a circuit diagram of the prior art.
Figure 2:
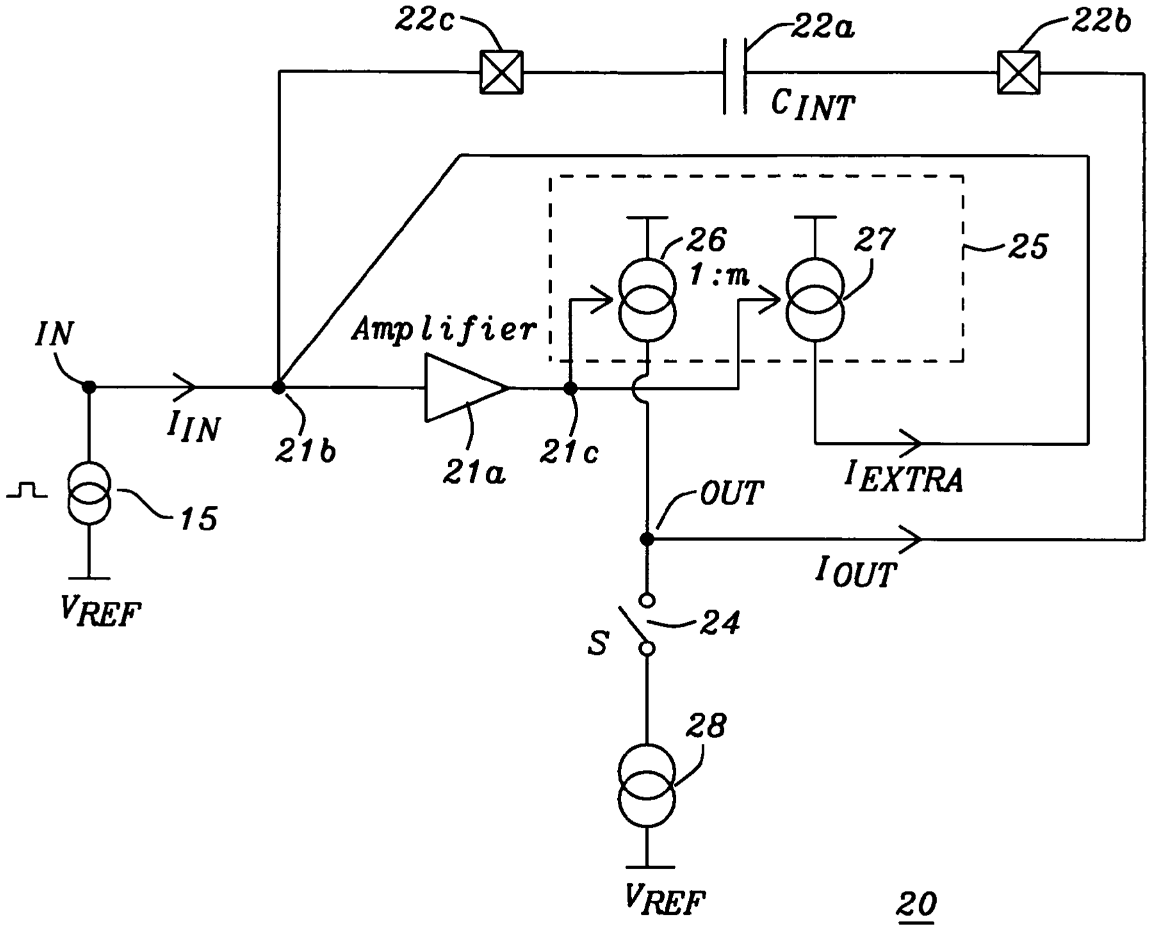
FIG. 2 is a circuit diagram of the preferred embodiment of the present invention.

In the preferred embodiment of the present invention of an adjustable integrator, a current mirror is used in the output stage of the amplifier which feeds back a duplicate of the output current of the amplifier to its input node. This is done on the die (chip) without requiring an extra pad. This method results in an integrator output voltage of:

$$V_{OUT} = \frac{I_{IN}t}{(1+m)C_{INT}}$$

where with reference to FIG. 2:

$V_{OUT}$ is the voltage at output OUT, $I_{IN}$ is the current flowing into the input of the amplifier, $C_{INT}$ is the integrating capacitor, and m is a factor for the current feedback replication.

Using current feedback, the range in the present invention is not limited to the voltage output range of the amplifier. The present invention utilizes only one capacitor and thus requires only two pads to handle the range switching. The extra current $I_{EXTRA}$ is generated by mirroring the current $I_{OUT}$ in the output stage of the amplifier. To avoid a DC offset in the mirrored current, the active load for the output stage is switched off during the integration phase. In the present invention, range switching is used to measure different charges with the same feedback capacitor ($C_{INT}$). This is achieved by a replication of the output current $I_{OUT}$ of the amplifier through the current mirror of the output stage which comprises a first and a second current source. The first current source with current $I_{OUT}$ is inserted between the output of the amplifier and output OUT, and the second current source with a replication factor m (relative to the first current source) and current $I_{EXTRA}$ is coupled between the output of the amplifier and its input node. Range switching, that is changing current $I_{EXTRA}$, is accomplished by changing the replication factor m.

Referring to FIG. 2, we now describe the adjustable integrator circuit 20 of the present invention. Circuit 20 comprises an amplifier means 21*a* (Amplifier) with an input 21*b* and an output 21*c*. Input 21*b* of amplifier means 21*a* is coupled to input IN which provides current pulses $Q=I_{IN}t$ from a current pulse generator 15 which in turn is tied to a reference potential $V_{REF}$ (typically GROUND). Output 21*c* is coupled to output stage 25, a current mirror with current sources 26 and 27, where output 21*c* is coupled to the control gates of current sources 26 and 27. The output of current source 26 is output OUT providing a current $I_{OUT}$. Output OUT is coupled via pad 22*b*, an external integrating capacitor means 22*a* ($C_{INT}$), and pad 22*c* to input 21*b* of amplifier means 21*a*. Also coupled to output OUT is a switching means 24 (S), which in turn is coupled via load device (current source 28, the active load) to a reference potential $V_{REF}$ (typically GROUND). In FIG. 2, switching means 24 is depicted as "OPEN", indicating the integration phase. The purpose of switching means 24 is to switch off the active load for the output stage during the integration phase to avoid a DC offset in the currents of current sources 26 and 27. The output of current source 27, which provides a current $I_{EXTRA}$, is coupled back directly to the input 21*b* of amplifier means 21*a*. The current $I_{OUT}$ relates to current $I_{EXTRA}$ as 1:m, where the selection of the replication factor "m" depends on the application.

Figure 3:
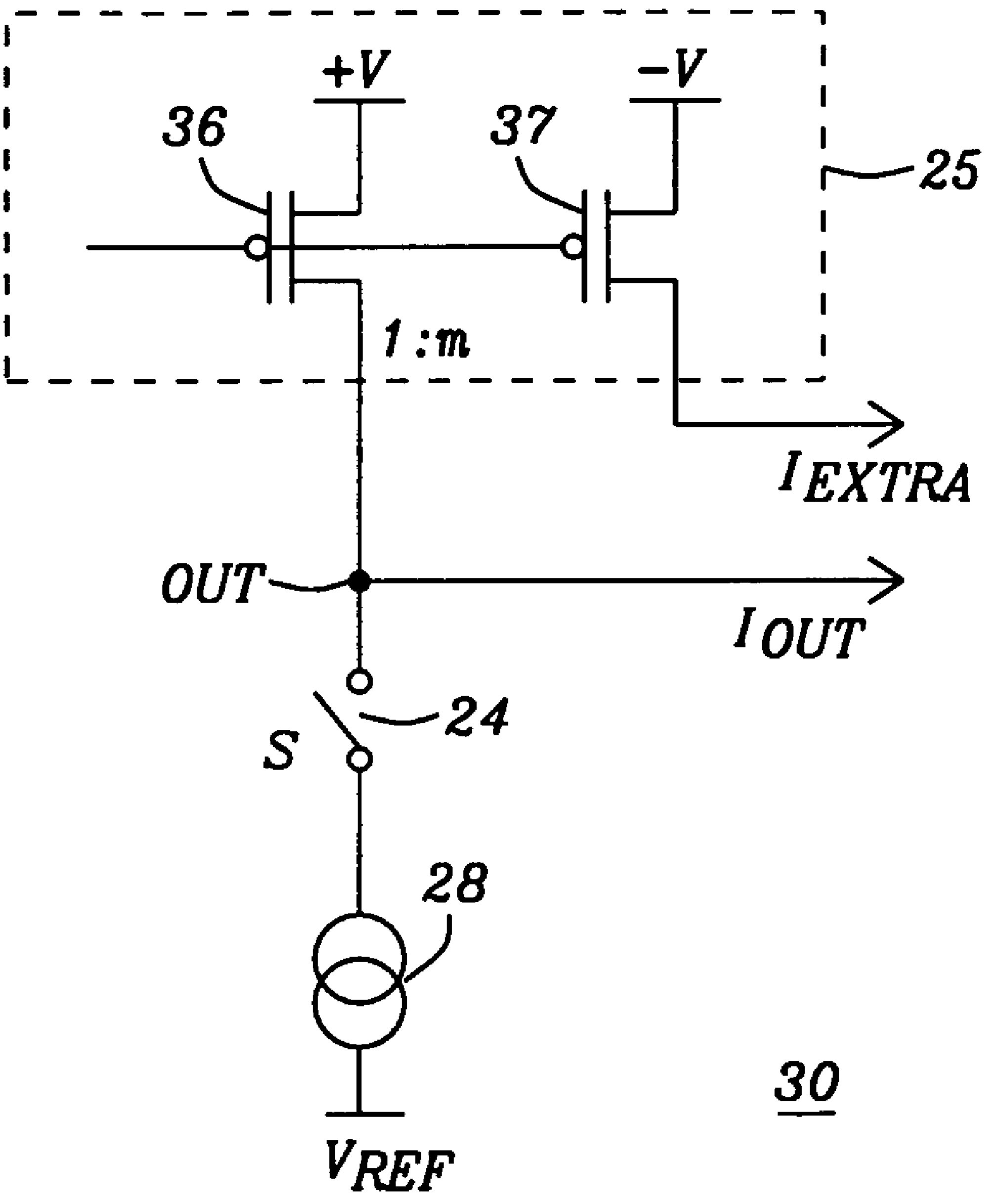
FIG. 3 is a detailed view of a portion of the circuit of FIG. 2.
Figure 4:
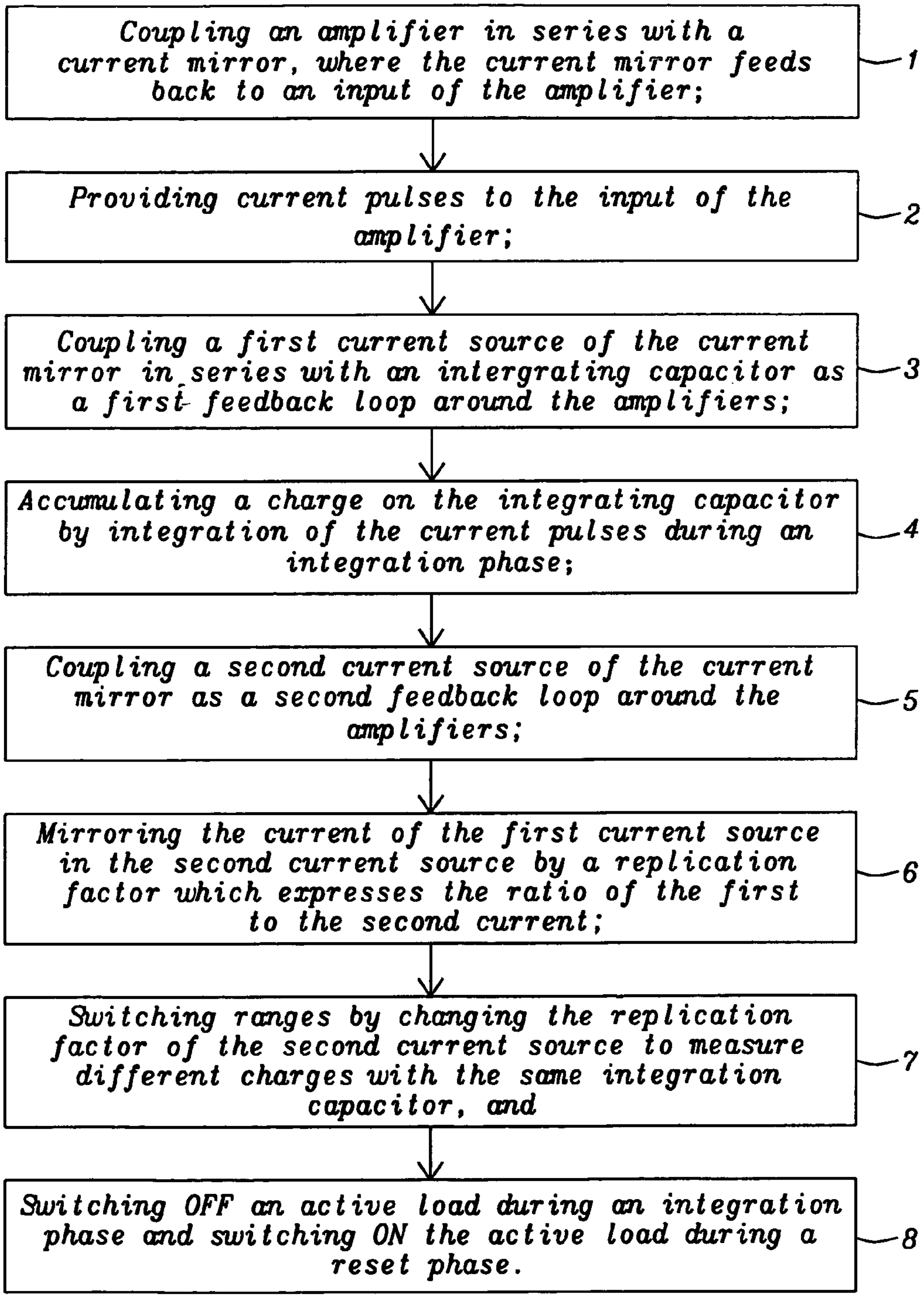
FIG. 4 is a block diagram of the method of the present invention.

Referring now to FIG. 3, we show a preferred embodiment of the output stages of current sources 26 and 27. Elements previously discussed are indicated by like numerals and need not be described further. Amplifiers 36 and 37 represent components of current sources 26 and 27, respectively and are depicted as PMOS transistors by way of example. Amplifiers 36 and 37 are tied to a voltage potential +V (shown as sources of transistors). The inputs of amplifiers 36 and 37 are tied together and receive their input via output 21*c* (shown as gates of transistors). The outputs of amplifiers 36 and 37 represent outputs $I_{OUT}$ and $I_{EXTRA}$, respectively (shown as drains of transistors). The output of amplifier 36 is output OUT and the output of amplifier 37 is output EXTRA. As in FIG. 2, output OUT, switching means 24 (S), and current source 28 are arranged as in FIG. 2.

Still referring to FIG. 3, the output device of amplifier 36 (depicted as the drain of a transistor) is loaded with current source 28 and thus forms the output of amplifier 36. Current source 28, generates the bias current for amplifier 36. Without switching means 24 (S), the current in the output device of amplifier 36 would be the output current $I_{OUT}$ plus the current flowing through current source 28. One aspect of the invention relies on the fact that the current $I_{EXTRA}$ is a precise multiplication of the output current $I_{OUT}$. During the reset phase of the integrator, when switching means 24 is closed and the amplifier is at its DC operating point, the current through the output device of amplifier 37 (depicted as the drain of a transistor) and current source 28 are equal. During the integration phase the switching means 24 is opened and the current $I_{EXTRA}$ is the exact replication of the output current $I_{OUT}$.

Amplifier means implies a device which amplifies a signal, and may be a transistor or a transistor circuit, either of these in discrete form or in integrated circuits (IC), a discrete amplifier, or a relay. These devices are cited by way of illustration and not of limitation, as applied to amplifier means.

Capacitor means implies a device which holds an electrical charge, and may be a transistor or a transistor circuit, either of these in discrete form or in integrated circuits (IC), wired to function as a capacitor, a capacitor in an integrated circuit (IC) or a discrete capacitor.

Switching means may imply devices such as a transistor or a transistor circuit, either of these in discrete form or in integrated circuits (IC), a relay, or a mechanical switch. These devices are cited by way of illustration and not of limitation, as applied to switching means.

We now describe the method of the preferred embodiment of the present invention of providing an adjustable integrator using a single capacitor:

a) Block 1 couples an amplifier in series with a current mirror, where the current mirror feeds back to an input of the amplifier;

b) Block 2 provides current pulses to the input of the amplifier;

c) Block 3 couples a first current source of the current mirror in series with an integrating capacitor as a first feedback loop around the amplifier;

d) Block 4 accumulates a charge on the integrating capacitor by integration of the current pulses during an integration phase;

e) Block 5 couples a second current source of the current mirror as a second feedback loop around the amplifier;

f) Block 6 mirrors the current of the first current source in the second current source by a replication factor which expresses the ratio of the first to the second current;

g) Block 7 switches ranges by changing the replication factor of the second current source to measure different charges with the same integration capacitor; and h) Block 8 switches OFF an active load during an integration phase and switches ON the active load during a reset phase.

ADVANTAGES

Advantages of the present invention are:

1. Only one external capacitor is needed;
2. Only two pads for connecting one external capacitor are needed;
3. An additional current, fed back to the input of the amplifier, can be used to increase the input range of the charge that can be measured.

While the invention has been particularly shown and described with reference to the preferred embodiments thereof, it will be understood by those skilled in the art that various changes in form and details may be made without departing from the spirit and scope of the invention.

What is claimed is:

1. An adjustable integrator, comprising:

an amplifier having an input and an output, where a signal applied at said input of said amplifier provides an amplified signal at said output;

a first feedback loop coupled between said output and said input, said first feedback loop comprising a capacitor, where said first feedback loop provides a first current for placing a charge on said capacitor, said capacitor thereby providing integration of said first current;

a second feedback loop coupled between said output and said input, said second feedback loop providing a mirrored current of said first current and fed back to said input to increase the input range of said charge; and where by switching means a load device is switched OFF during an integration phase and is switched ON during a reset phase.

2. The adjustable integrator of claim 1, wherein said first current is derived from a first current source.

3. The adjustable integrator of claim 2, wherein a ratio ‘m’ of the currents of said first current to said mirrored current is expressed by the replication factor m.

4. The adjustable integrator of claim 3, wherein said replication factor m depends on the application.

5. The adjustable integrator of claim 1, wherein said load device for generating a bias current, is coupled to an output of said first current source to provide an active load for said first feedback loop.

6. The adjustable integrator of claim 1, wherein said capacitor is a discrete capacitor, or an integrated capacitor.

7. An adjustable integrator, comprising:

an amplifier having an input and an output, where a signal applied at said input of said amplifier provides an amplified signal at said output;

an output stage with an input and a first and a second output, said input of said output stage coupled to said output of said amplifier, said output stage comprising a current mirror which feeds back to said input of said amplifier a replication of an output current of said amplifier, said output stage further comprising:

a first feedback loop comprising in series a first current source of said current mirror and a capacitor, where said first current source, at said first output of said output stage, provides a first current for placing a charge on said capacitor, said capacitor thereby providing integration of said first current; and a second feedback loop comprising a second current source of said current mirror which mirrors said first current source, where a ratio ‘m’ of the currents of said first current to said second current is expressed by the replication factor m, where said second current source, at said second output of said output stage, provides a second current fed back to said input of said amplifier thereby increasing the input range of said charge; and a load device for generating a bias current, coupled to said first current source, at said first output of said output stage, to provide an active load for said first feedback loop, where by switching means said load device is switched OFF during an integration phase to prevent a DC offset in said first and second current source and is switched ON during a reset phase.

8. The adjustable integrator of claim 7, wherein said replication factor m of said second current source depends on the application.

9. The adjustable integrator of claim 7, wherein a switch is coupled in series with said first current source, at said first output of said output stage, and said load device.

10. The adjustable integrator of claim 9, wherein said switch may be a transistor or a transistor circuit, or a relay, or a mechanical switch.

11. The adjustable integrator of claim 10, wherein said transistor may be in discrete form or an integrated circuit.

12. The adjustable integrator of claim 10, wherein said transistor circuit may be in discrete form or an integrated circuit.

13. The adjustable integrator of claim 7, wherein said capacitor is a discrete or an integrated capacitor.

14. A method of creating an adjustable integrator using a single capacitor, comprising the steps of:

a) coupling an amplifier in series with a current mirror, where said current mirror feeds back to an input of said amplifier;

b) providing current pulses to said input of said amplifier;

c) coupling a first current source of said current mirror in series with an integrating capacitor as a first feedback loop around said amplifier;

d) accumulating a charge on said integrating capacitor by integration of said current pulses during an integration phase;

e) coupling a second current source of said current mirror as a second feedback loop around said amplifier;

f) mirroring the current of the first current source in the second current source by a replication factor which expresses the ratio of the first to the second current;

g) range switching by changing, depending on the application, the replication factor of the second current source to measure different charges with the same integration capacitor; and h) switching OFF an active load during an integration phase to avoid a DC offset in the currents of the first and second current sources and switching ON the active load during a reset phase.

15. The method of claim 14, wherein a load device is coupled to the output of said first current source to provide said active load for said first current source.

* * * * *